(12) United States Patent
Burr

(10) Patent No.: US 6,348,372 B1
(45) Date of Patent: Feb. 19, 2002

(54) METHOD FOR REDUCING PN JUNCTION LEAKAGE

(75) Inventor: James B. Burr, Foster City, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/648,867

(22) Filed: Aug. 25, 2000

Related U.S. Application Data

(62) Division of application No. 09/028,472, filed on Feb. 24, 1998, now Pat. No. 6,137,142.

(51) Int. Cl.[7] ............... H01L 21/8238; H01L 21/336; H01L 21/331
(52) U.S. Cl. ............... 438/223; 438/224; 438/282; 438/370
(58) Field of Search ............... 438/175, 199, 438/211, 223, 224, 227, 282, 370, 526

(56) References Cited

U.S. PATENT DOCUMENTS

| | | | | |
|---|---|---|---|---|
| 4,130,827 A | * | 12/1978 | D'Altroy et al. ........... 257/156 |
| 4,646,124 A | * | 2/1987 | Zunino ........................ 257/370 |
| 4,921,811 A | * | 5/1990 | Watanabe et al. ........... 438/207 |
| 4,927,776 A | * | 5/1990 | Soejima ....................... 438/207 |
| 5,151,382 A | * | 9/1992 | Josquin et al. .............. 438/322 |
| 5,162,887 A | * | 11/1992 | Dierschke ................... 257/465 |
| 5,243,214 A | * | 9/1993 | Sin et al. ..................... 257/372 |
| 5,293,060 A | | 3/1994 | Komori et al. ............. 257/544 |
| 5,304,833 A | | 4/1994 | Shigeki et al. ................ 257/76 |
| 5,362,981 A | | 11/1994 | Sato et al. ................... 257/371 |
| 5,795,803 A | * | 8/1998 | Takamura et al. .......... 438/228 |

* cited by examiner

Primary Examiner—Matthew Smith
Assistant Examiner—Lex H. Malsawma
(74) Attorney, Agent, or Firm—Gunnison, McKay & Hodgson, L.L.P.; Philip J. McKay

(57) ABSTRACT

To reduce p-n junction leakage at the boundary between lightly doped wells formed in lightly doped bulk materials, a high concentration region is implanted at the junction. The high concentration region contains a relatively high dopant level, and thus reduces the width of the depletion region at the junction. The reduced width of the depletion region in turn reduces junction leakage.

14 Claims, 5 Drawing Sheets

METHOD FOR REDUCING PN JUNCTION LEAKAGE

RELATED APPLICATIONS

This application is a divisional application of U.S. patent application Ser. No. 09/028,472 now U.S. Pat. No. 6,137,142, entitled "MOS Device Structure and Method for Reducing PN Junction Leakage" of James B. Burr, filed on Feb. 24, 1998, and which is incorporated herein by reference in its entirety.

BACKGROUND OF THE INVENTION

1. Field of the Invention

The present invention generally relates to semiconductor devices, and in particular, the present invention relates device structures and methods which reduce junction leakage particularly in lightly doped devices. Although not limited thereto, the invention is especially applicable to low-voltage CMOS (LVCMOS), or ultra-low power CMOS (ULP), implementations, as well as to SOI (silicon-on-insulator) buried well configurations.

2. Description of the Related Art

There are a number of factors which contribute to the magnitude of a transistor device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a device's threshold voltage by a few tens or even hundreds of millivolts. Further, dimensional variations (such as channel width and especially channel length), charge trapping in the materials and interfaces, and environmental factors such as operating temperature fluctuations can shift the threshold voltage. Still further, low threshold devices may leak too much when their circuits are in a sleep or standby mode. Thus, particularly for low-threshold devices, it is desirable to provide a mechanism for tuning the threshold voltage to account for these and other variations. This can be accomplished using back biasing, i.e. controlling the potential between a device's well and source. See James B. Burr, "Stanford Ultra Low Power CMOS," Symposium Record, Hot Chips V, pp. 7.4.1–7.4.12, Stanford, Calif. 1993, which is incorporated herein by reference for all purposes.

A basic characteristic of back-biased transistors resides in the ability to electrically tune the transistor thresholds. This is achieved by reverse biasing the bulk of each MOS transistor relative to the source to adjust the threshold potentials. Typically, the potential will be controlled through isolated ohmic contacts to the source and well regions together with circuitry necessary for independently controlling the potential of these two regions.

However, in any semiconductor structure having biased and abutting n and p regions, diode leakage through the pn junction is possible. Junction leakage is a function of junction bias and junction doping. The greater the junction bias, the wider the depletion region, and thus the greater the leakage. The amount of leakage also increases for lightly doped junctions which are accompanied by wide depletion regions. Conversely, leakage decreases for more heavily doped junctions having relatively narrow depletion regions. Also, while a larger depletion region is accompanied by a larger leakage, the capacitance of the junction is lower.

The problems associated with leakage current can be particularly acute for low-threshold voltage devices having intrinsic or nearly intrinsic channels. As mentioned above, such devices are characterized by the provision of as little dopant as possible to achieve high mobility in the channel region. This is accomplished by the use of near-intrinsic silicon on the substrate side of the source/drain junctions.

FIG. 1(a) illustrates an example of a back-biased n-well configuration. That is, in the exemplary CMOS configuration of FIG. 1(a), each of an NFET 101 and a PFET 102 essentially constitutes a four-terminal device. The NFET 101 is made up of an n-region source 103, a gate electrode 104, an n-region drain 105, and a p⁻ bulk substrate 106. The NFET 101 may also include a p-well 107 as shown. Similarly, the PFET 102 includes p-region source 108, a gate electrode 109 and a p-region drain 10 formed in an n-well 111. Reference numeral 112 is a p⁺ plug which forms a bulk terminal or well tie for the bulk material 106, and reference numeral 113 is an n⁺ plug forming a well tie for the n-well 111.

In the back-biased CMOS design of FIG. 1(a), the well contact 112 of the bulk material 106 is split off from the source terminal 103 of the NFET 101 by providing a separate metallic rail contact 116 which is spaced from the metallic rail contact 114 of the source terminal 103. Rail contact 116 is connected to a bias voltage source Vpw. Likewise, the well contact 113 of the n-well 111 is split off from the source terminal 108 of the PFET 102 by providing a separate metallic rail contact 118 which is spaced from the metallic rail contact 115 of the source terminal 108. Rail contact 118 is connected to a bias voltage source Vnw. Thus, in this example, the substrate bias potential of the NFET 101 is set by Vpw, and that of the PFET 102 is set by Vnw.

FIG. 1(b) illustrates a similar design, except that the substrate or bulk of the NFET 101 is biased to Vpw by way of a metallic back plane 119, rather than by way of the well tie 116 shown in FIG. 1(a).

As mentioned above, in order to provide near-zero threshold voltages, the channel regions of the devices should be constituted of near intrinsic semiconductor material. In typical non-near-zero threshold devices, surface dopant concentrations in the channel regions will be on the order of 1e17 (per cm³), thus allowing for the selection of a base material on the order of 1e16. In the context of FIGS. 1(a) and 1(b), this would mean that the bulk material 106 would have a concentration of about 1e16 and the p-well 107 and the n-well 111 would have a concentration (particularly at the surface regions) of about 1e17. Even at these concentrations, leakage is present between the n-well 111 and the p-bulk 106. Moreover, for low threshold voltage devices, a surface dopant concentration on the order of 1e15 is desired, meaning that a bulk material is selected having a concentration of about 1e14. These reduced concentrations widen the depletion regions at the p-n junctions, and thus further exacerbate the problem of leakage currents at the p-n junctions. Such leakage is illustrated in FIGS. 1(a) and 1(b) by the multiple arrows extending across the boundary between the n-well 111 and the p-bulk 106.

Junction leakage can present problems in other configurations as well. For example, FIG. 2 is a simplified view of an SOI buried well device. This particular to device is characterized by a buried n-well 202 (i.e., an inverse well) implanted beneath a buried oxide layer 204. The buried well 202 is an n+ region forming a back gate electrode. The oxide layer 204 is buried in a p-substrate material 206 which is lightly doped to accommodate the concentration characteristics needed for the channel region located above the oxide layer 204 and between source and drain regions 208 and 210. Reference number 207 is an isolation oxide. As an example, the n-well may have a concentration of about 1e17, and the p-substrate 206 may have a concentration on the order of 1e16. As illustrated by the multiple arrows in FIG. 2, the device suffers junction leakage between the n-well 202 and the p-substrate 206.

SUMMARY OF THE INVENTION

It is thus an object of the present invention to provide a semiconductor device structure and method which reduce junction leakage across p-n junctions.

It is a further object of the present invention to provide a semiconductor device structure and method which reduce junction leakage in MOS device structures, and particularly in lightly doped back biased circuits having near-zero threshold voltages, and/or in SOI buried well devices.

According to one aspect of the present invention, a semiconductor device is provided which includes a semiconductor bulk material of a first conductivity type and having a first dopant concentration; a semiconductor well of a second conductivity type contained in the semiconductor bulk material; and a semiconductor region of the first conductivity type and having a second dopant concentration which is greater than the first dopant concentration, the semiconductor region interposed between a bottom wall of the semiconductor well and the semiconductor bulk material to reduce leakage across a junction between the bottom wall of the semiconductor well and the semiconductor bulk material.

According to another aspect of the present invention, the semiconductor device further includes at least one second semiconductor region of the first conductivity type and having a third dopant concentration which is greater than the first dopant concentration, the at least one second semiconductor region interposed between at least one side wall of the semiconductor well and the semiconductor bulk material to reduce leakage across a junction between the at least one side wall of the semiconductor well and the semiconductor bulk material.

According to yet another aspect of the invention, the semiconductor device further includes source and drain regions of the first conductivity type formed in the semiconductor well to define a channel region therebetween.

According to still another aspect of the present invention, a dopant concentration of the semiconductor well is greater at a boundary with the semiconductor region than at the channel region.

According to still another aspect of the present invention, the semiconductor well is buried within the bulk material, and the semiconductor device further includes an insulator layer interposed between a top wall of the semiconductor well and a top surface of the semiconductor bulk material, and source and drain regions of the second conductivity type extending from the top surface of the semiconductor bulk material and a top wall of the insulator layer.

According to another aspect of the present invention, a semiconductor device is provided which includes a semiconductor bulk material of a first conductivity type and having a first dopant concentration; a semiconductor well of a second conductivity type contained in the bulk material; a first transistor formed in the semiconductor bulk material, the first transistor having source and drain regions of the second conductivity type and defining a first channel region therebetween; a second transistor formed in the semiconductor well, the second transistor having source and drain regions of the first conductivity type and defining a second channel region therebetween; means for biasing the first and second channel regions; and a semiconductor region of the first conductivity type and having a second dopant concentration which is greater than the first dopant concentration, the semiconductor region interposed between a bottom wall of the semiconductor well and the semiconductor bulk material to reduce leakage across a junction between the bottom wall of said semiconductor well and the semiconductor bulk material. The first and second transistors may have near-zero threshold voltages.

According to yet another aspect of the present invention, a method is provided for reducing junction leakage in a semiconductor device having a semiconductor well of a first conductivity formed in a semiconductor material of a second conductivity, the method including implanting a semiconductor region of the first conductivity so as to be interposed between a bottom wall of the semiconductor well and the semiconductor material, wherein a dopant concentration of the semiconductor region is greater than that of the semiconductor material so as to reduce the width of a depletion region at a junction between the bottom wall of the semiconductor well and the semiconductor material.

BRIEF DESCRIPTION OF THE DRAWINGS

The above and other features and advantages of the present invention will become readily apparent from the description that follows, with reference to the accompanying drawings, in which.

DETAILED DESCRIPTION OF THE PREFERRED EMBODIMENTS

The present invention is at least partially characterized by the implantation of a high concentration (p+ or n+) region at the junction boundary for which leakage current is to be reduced. In the case of MOS n-well designs, the p+ dopant is preferably buried at a depth sufficient to result in a junction capacitance less than 20% of the gate capacitance (for performance optimization) and will arrest depletion region growth as a function of back bias. Also, the high concentration region should preferably have a dopant level which is higher than that of the surrounding bulk material by a factor of about 10 or more.

Figure 3A:
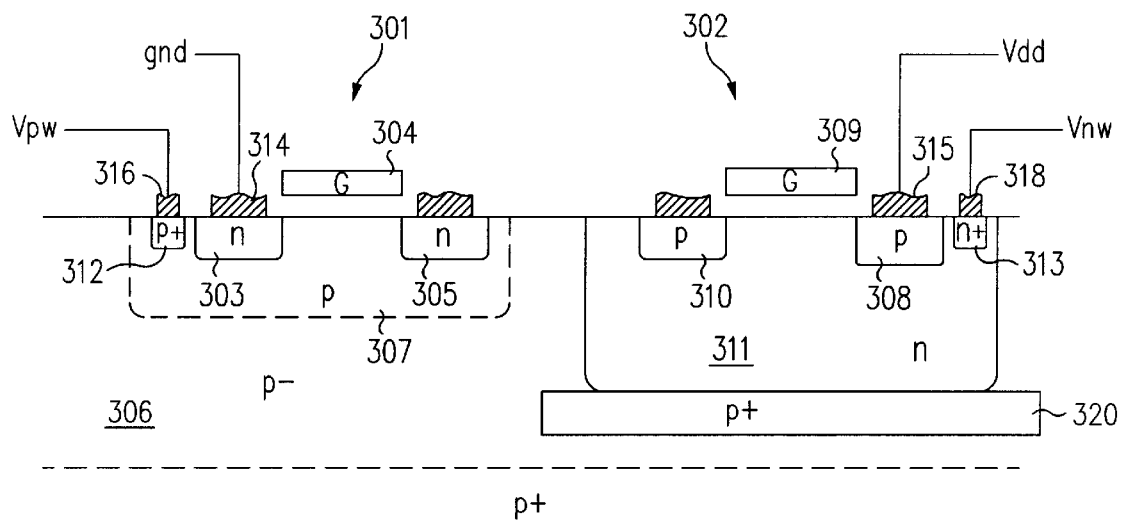
FIGS. 3(a) and 3(b) illustrate examples of back-biased CMOS configurations employing buried p+ regions for reducing junction leakage at a bottom wall of an n-well according to the present invention.
Figure 3B:
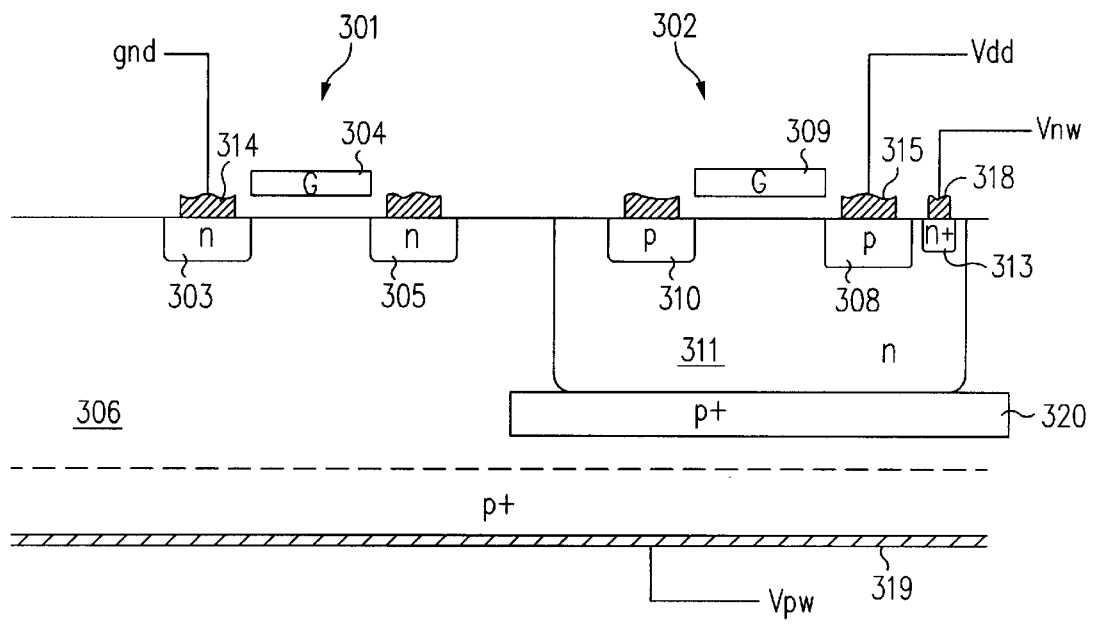

Attention is now directed to FIG. 3 for an explanation of the invention as it may be applied to a CMOS device. In this example, each of an NFET 301 and a PFET 302 essentially constitutes a four-terminal device. The NFET 301 is made up of an n-region source 303, a gate electrode 304, an n-region drain 305, and a p bulk substrate 306. The NFET 301 may also include a p-well 307 as shown. Similarly, the PFET 302 includes p-region source 308, a gate electrode 309 and a p-region drain 310 formed in an n-well 311. Reference numeral 312 is a p$^+$ plug which forms a bulk terminal or well tie for the p-well 307 or bulk material 306, and reference numeral 313 is an n$^+$ plug forming a well tie for the n-well 311.

In the back-biased CMOS design of FIG. 3(*a*), the well contact 312 of the bulk material 306 is split off from the source terminal 303 of the NFET 301 by providing a separate metallic rail contact 316 which is spaced from the metallic rail contact 314 of the source terminal 303. Rail contact 316 is connected to a bias voltage source Vpw. Likewise, the well contact 313 of the n-well 311 is split off from the source terminal 308 of the PFET 302 by providing a separate metallic rail contact 318 which is spaced from the metallic rail contact 315 of the source terminal 308. Rail contact 318 is connected to a bias voltage source Vnw. Thus, in this example, the substrate bias potential of the NFET 301 is set by Vpw, and that of the PFET 302 is set by Vnw.

FIG. 3(*b*) illustrates a similar design, except that the substrate or bulk of the NFET 301 is biased to Vpw by way of a metallic back plane 319, rather than by way of the well tie 316 shown in FIG. 3(*a*).

Figure 1A:
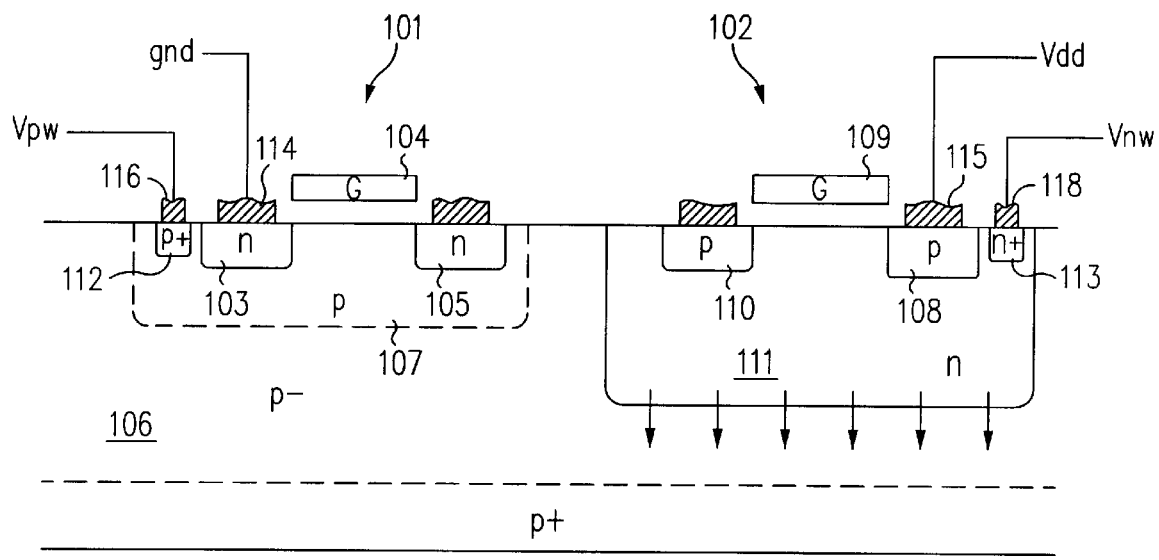
FIGS. 1(a) and 1(b) illustrate conventional back-biased CMOS configurations.
Figure 1B:
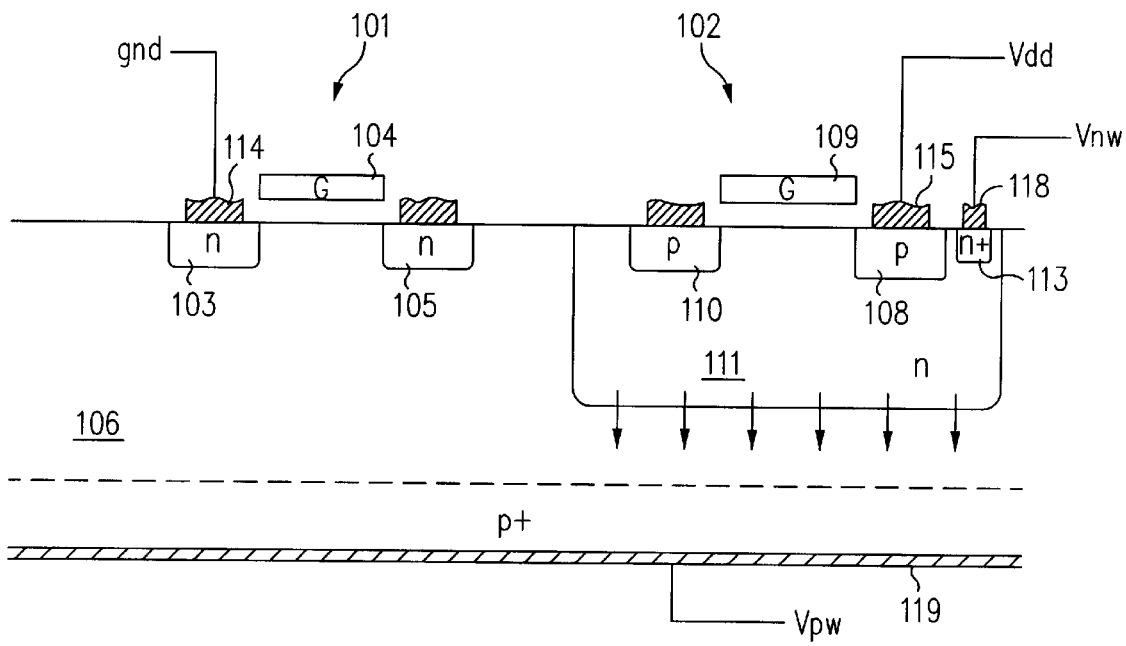
Figure 2:
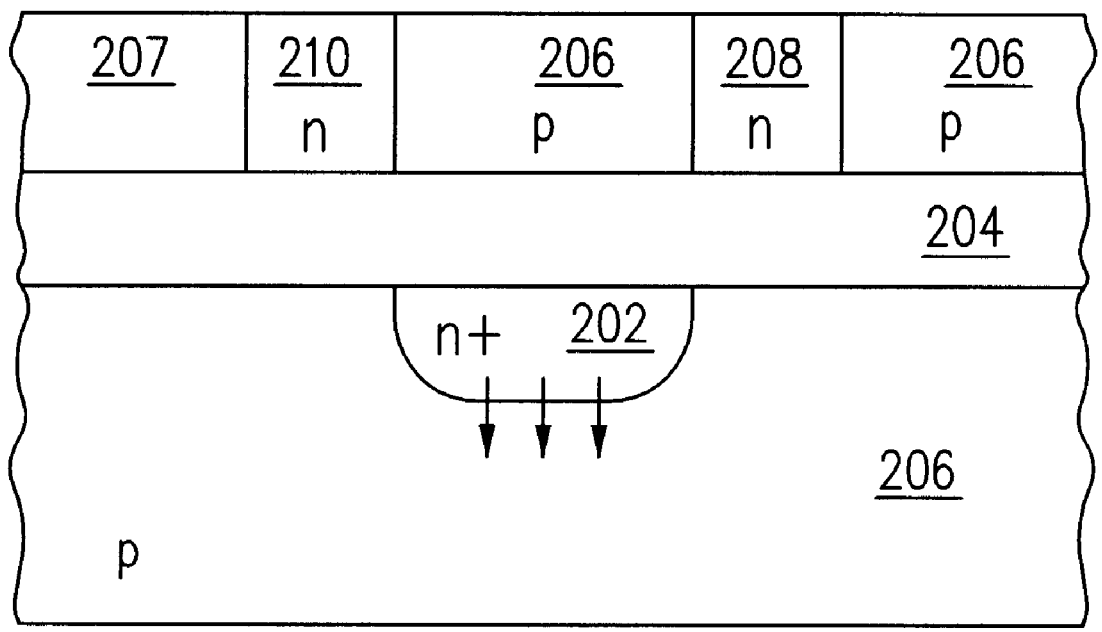
FIG. 2 is a simplified view of an SOI buried well device.

As should be readily apparent, the configurations of FIGS. 3(*a*) and 3(*b*) are similar to those of FIGS. 1(*a*) and 1(*b*) discussed previously, except for the provision of buried p+ regions 320 at the bottom wall junction between n-well 311 and the p-bulk 306. The p+ regions 320 are heavily doped regions (i.e., p+ regions), and thus reduce the width of the depletion region at the p-n junction of the n-well 311 and the p-bulk 306. The reduced depletion region is accompanied by reduced leakage through the bottom wall of the n-well 320.

In this example, the devices are configured as near-zero voltage threshold devices. As such, the dopant concentrations of the n-well 311 (particularly in the channel region) is on the order of 1e15, and that of the p-bulk 306 is about 1e14, and the dopant concentration of the p+ regions 320 could be on the order of 1e17, thereby substantially reducing the width of the depletion region at the p-n junction.

Figure 4:
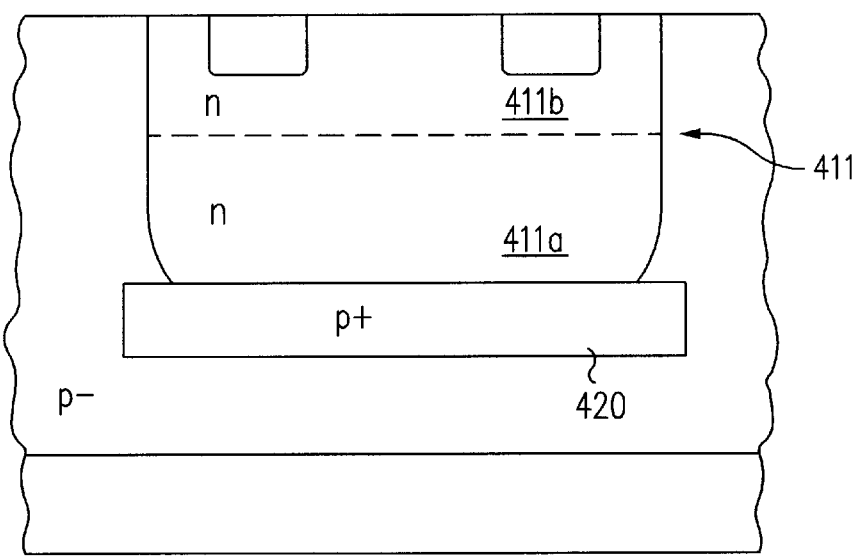
FIG. 4 illustrates an example of a device in which an n-well is retrograded to further reduce junction leakage.

The depletion region width can be further reduced by adopting a retrograde n-well structure in which the dopant concentration in the n-well increases with depth. That is, while it is important that any low or near-zero voltage threshold device be near intrinsic at the channel region, such is not necessary deep within the n-well. This is illustrated in FIG. 4 which shows n-well 411 having two n-regions 411*a* and 411*b*. The region 411*a* abuts the p+region 420 and has a dopant concentration, for example, of about 1e16, whereas the region 411*b* is partially contained within the channel region of the device and has a dopant concentration, for example, of about 1e15. As such, the concentrations at the p-n junction are 1e16 for the n-region 411*a* and 1e17 for the p-region 420, thus reducing the width of depletion region as compared to the example above in which the n-region at the junction has a concentration of 1e15.

Also, although not shown in the retrograde well configuration of FIG. 4, the well 411 can be subjected to lateral grading as well (or lateral grading alone) to reduce p-n junction leakage at the sidewalls of the well 411. As opposed to the retrograde profile which can be done with appropriate dose and energy, the lateral grading would be accomplished by an additional implant in which the channel region is masked.

According to the present invention, leakage is reduced along p-n junctions by elevating the dopant concentration on one or both sides of the junction. Typically, one side will have a higher concentration than the other, such as an n-well in a p-substrate, so only p-enhancement is necessary. However, in some cases, especially in low threshold devices, the well is sufficiently lightly doped that both p-enhancement and n-enhancement are necessary. This enhancement may be applied to the bottom or sidewalls or both. In standard devices it may not be necessary to increase dopant concentration at the junctions due to the higher dopant concentrations resulting from the high thresholds. However, it becomes much more important in low threshold devices, especially when a potentially large back bias is applied.

Figure 5:
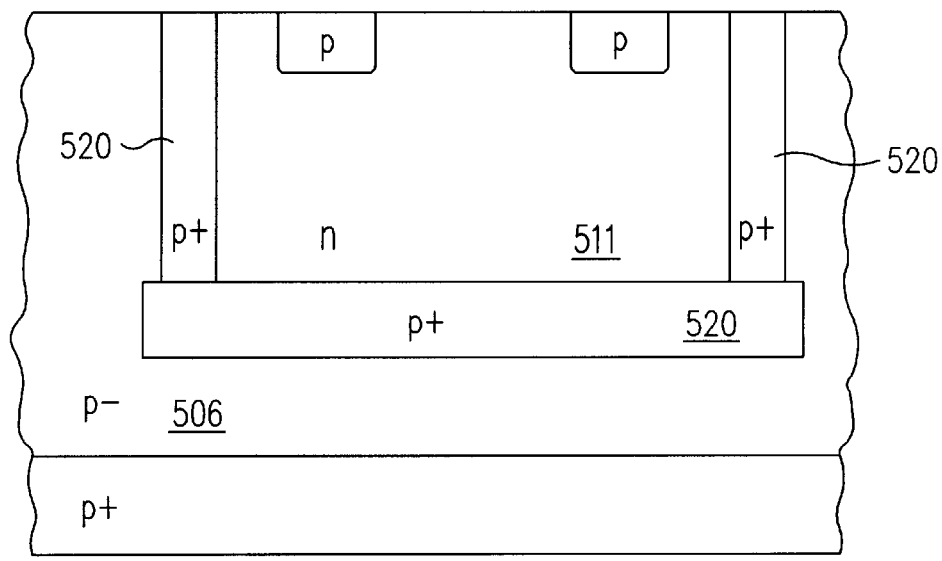
FIG. 5 illustrates an example of a device in which buried p+ regions are employed to reduce junction bias at a bottom wall and side walls of an n-well according to the present invention.

A technique for further reducing n-well leakage is illustrated in FIG. 5. In this example, the sidewalls of the n-well 511 are surrounded by p+ regions 520. Again, the p+ regions 520 are high concentration regions which reduce the width of the depletion region at the sidewall boundaries. For example, the dopant concentration of the p+ regions 520 may be about 1e17, while those of the p-bulk 506 and the n-well 511 may be on the order of 1e14 and 1e15, respectively. Also, the retrograde well of FIG. 4 may be adopted in the configuration of FIG. 5, to even further reduce junction leakage.

Figure 6:
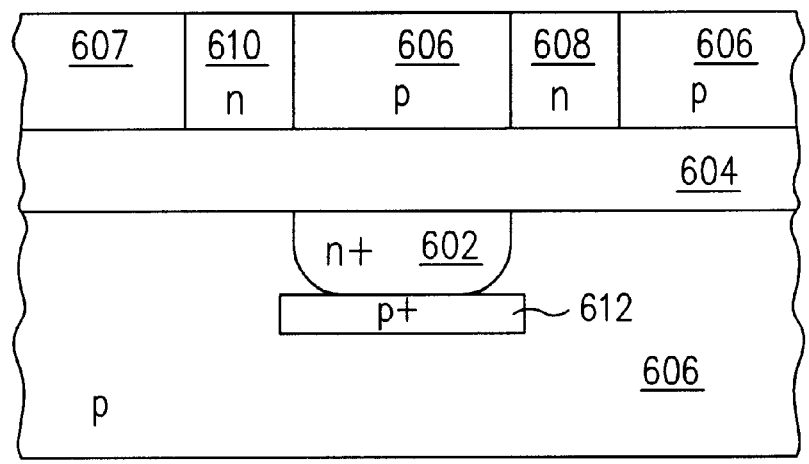
FIG. 6 shows an SOI buried well configuration employing a buried p+ region for reducing junction bias at a bottom wall of an buried n-well; and, FIG. 7 shows an SOI buried well configuration employing p+ regions for reducing junction bias at a bottom wall and side walls of an buried n-well.

FIG. 6 illustrates an example in which the technique of the present invention is applied to an SOI buried well device. This device includes a buried n-well 602 (i.e., an inverse well) implanted beneath a buried oxide layer 604. The buried well 602 is an n+ region forming a back gate electrode. The oxide layer 604 is buried in a p-substrate material 606 which is lightly doped to accommodate the concentration characteristics needed for the channel region located above the oxide layer 604 and between source and drain regions 608 and 610. Reference numeral 607 is an isolation oxide. As an example, the n-well 602 may have a concentration of about 1e17, and the p-substrate 606 may have a concentration on the order of 1e16. In order to reduce leakage between the buried n-well 602 and the p-substrate 606, the device further includes a high concentration region 612 interposed between a bottom wall of the n-well 602 and the p-substrate 606. Continuing with the same example, the region 612 may have a dopant concentration on the order of 1e17, thus reducing the width of the depletion region at the bottom wall p-n junction.

Figure 7:
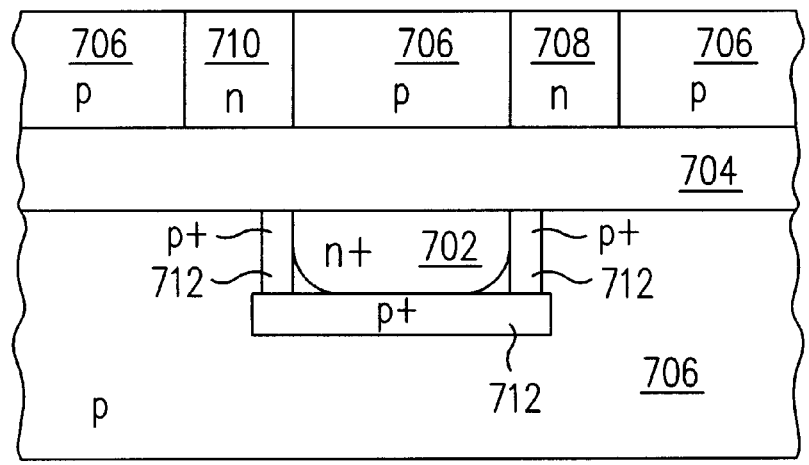

In another example shown in FIG. 7, the sidewalls of the buried n-well 702 are surrounded by a p+ regions 712. Again, the p+ regions 712 are high concentration regions which reduce the width of the depletion region at the sidewall boundaries. For example, the dopant concentration of the p+ regions 712 may be about 1e17, while those of the p-substrate 706 and the n-well 702 may be on the order of 1e16 and 1e17, respectively.

It is noted that in each of the embodiments described above, the p+ regions for arresting leakage may be formed to either abut or overlap the n-region of the p-n junction for which leakage is to be reduced. Implantation techniques for forming buried layers of different conductivities and concentrations within semiconductor materials are well known in the art and may be readily applied in forming the various structures described above. Also, the invention is equally applicable to arresting leakage of p-wells using highly doped n+ regions.

The technique of the present invention at least partially resides in the provision of high concentration regions at low concentration p-n junctions to reduce the width of the depletion regions of the p-n junctions. This in turn reduces leakage across the p-n junctions. Many structural variations for realizing such high concentration regions for arresting p-n junction leakage may be contemplated by those skill in the art. In this respect, the present invention has been described by way of specific exemplary embodiments, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation as illustrated and described. Hence all suitable modifications and equivalents may be resorted to as falling with the scope of the invention.

What is claimed is:

1. A method for reducing junction leakage in a semiconductor device having a semiconductor well of a first conductivity type formed in a semiconductor bulk material of a second conductivity type, said method comprising:

implanting a first semiconductor region of the second conductivity type such that said semiconductor region is interposed between a bottom wall of said semiconductor well and said semiconductor bulk material, wherein a dopant concentration of said first semiconductor region is greater than that of said semiconductor bulk material so as to reduce the width of a depletion region at a junction between said bottom wall of said semiconductor well and said semiconductor bulk material.

2. A method as claimed in claim 1, further comprising:

implanting at least a second semiconductor region of the second conductivity type such that said second semiconductor region is interposed between at least one side wall of said semiconductor well and said semiconductor bulk material, wherein a dopant concentration of said second semiconductor region is greater than that of said semiconductor bulk material so as to reduce the width of a depletion region at a junction between said at least one sidewall of said semiconductor well and said semiconductor bulk material.

3. A method as claimed in claim 2, further comprising:

forming a transistor at a surface region of said semiconductor well so as to define a channel region in said semiconductor well; and implanting a higher dopant concentration at a region of said semiconductor well located at a boundary with said first semiconductor region than at said channel region of semiconductor well.

4. A method as claimed in claim 1, further comprising:

forming a transistor at a surface region of said semiconductor well so as to define a channel region in said semiconductor well; and implanting a higher dopant concentration at a region of said semiconductor well located at a boundary with said first semiconductor region than at said channel region of semiconductor well.

5. A method for reducing junction leakage in a semiconductor device comprising:

forming a semiconductor substrate of a bulk material of a first conductivity type and having a first dopant concentration, said semiconductor substrate having a substrate top surface and a substrate bottom surface, opposite said substrate top surface;

forming a semiconductor well of a second conductivity type such that said semiconductor well is contained in said semiconductor substrate, said well having a well top surface coextensive with a first portion of said substrate top surface, a well bottom surface, opposite said well top surface, a first well side surface and a second well side surface, opposite said first well side surface;

forming a buried semiconductor region of said first conductivity type, said buried semiconductor region having a buried semiconductor region top surface, said buried semiconductor region being formed in said semiconductor substrate below said well bottom surface and interposed between said well bottom surface and said semiconductor substrate bulk material such that said buried semiconductor region top surface abuts said well bottom surface and said buried semiconductor region does not contact both said first and second well side surfaces, said buried semiconductor region having a second dopant concentration of said first conductivity type which is greater than said first dopant concentration of said first conductivity type;

wherein, said buried semiconductor region is formed and positioned between said well bottom surface and said semiconductor substrate bulk material to reduce leakage across a junction between said semiconductor well and said semiconductor substrate bulk material.

6. A method for reducing junction leakage in a semiconductor device as claimed in claim 5, further comprising:

forming source and drain regions of the first conductivity type in said semiconductor well to define a channel region therebetween.

7. A method for reducing junction leakage in a semiconductor device as claimed in claim 6, further comprising:

controlling the dopant concentration of said semiconductor well such that dopant concentration of said semiconductor well is greater at a boundary with said buried semiconductor region than at said channel region.

8. A method for reducing junction leakage in a semiconductor device as claimed in claim 5, further comprising:

burying said semiconductor well within said semiconductor substrate bulk material;

forming an insulator layer interposed between said well top surface of said semiconductor well and said substrate top surface of said semiconductor substrate bulk material; and forming source and drain regions of the second conductivity type to extend from said substrate top surface of said semiconductor substrate bulk material and a top surface of said insulator layer.

9. A method for reducing junction leakage in a semiconductor device comprising:

forming a semiconductor substrate of a bulk material of a first conductivity type and having a first dopant concentration, said semiconductor substrate having a substrate top surface and a substrate bottom surface, opposite said substrate top surface;

forming a semiconductor well of a second conductivity type, said semiconductor well being contained in said semiconductor substrate bulk material, said well having a well top surface formed to be coextensive with a first portion of said substrate top surface, a well bottom surface, opposite said well top surface, a first well side surface and a second well side surface, opposite said first well side surface;

forming a first transistor in said semiconductor substrate bulk material, said first transistor having source and drain regions of the second conductivity type and defining a first channel region therebetween;

forming a second transistor in said semiconductor well, said second transistor having source and drain regions of the first conductivity type and defining a second channel region therebetween;

providing means for biasing said first and second channel regions; and, forming a buried semiconductor region of said first conductivity type, said buried semiconductor region having a buried semiconductor region top surface, said buried semiconductor region being situated in said semiconductor substrate below said well bottom surface and interposed between said well bottom surface and said semiconductor substrate bulk material such that said buried semiconductor region top surface abuts said well bottom surface and said buried semiconductor region does not contact both said first and second well side surfaces, said buried semiconductor region having a second dopant concentration of said first conductivity type which is greater than said first dopant concentration of said first conductivity type to reduce leakage across a junction between said semiconductor well and said semiconductor substrate bulk material.

10. A method for reducing junction leakage in a semiconductor device as claimed in claim 9, further comprising:

controlling a dopant concentration of said semiconductor well such that said dopant concentration of said semiconductor well is greater at a boundary with said buried semiconductor region than at said second channel region.

11. A method for reducing junction leakage in a semiconductor device as claimed in claim 10, further comprising:

forming said first and second transistors such that said first and second transistors have near-zero threshold voltages.

12. A method for reducing junction leakage in a semiconductor device as claimed in claim 9, further comprising:

forming said first and second transistors such that first and second transistors have near-zero threshold voltages.

13. A method for reducing junction leakage in a semiconductor device comprising:

forming a semiconductor substrate of a bulk material of a first conductivity type and having a first dopant concentration, said semiconductor substrate having a substrate top surface and a substrate bottom surface, opposite said substrate top surface;

forming a semiconductor well of a second conductivity type contained in said semiconductor substrate bulk material, said well having a well top surface formed to be coextensive with a first portion of said substrate top surface, a well bottom surface, opposite said well top surface, a first well side surface and a second well side surface, opposite said first well side surface; and forming a buried semiconductor region of said first conductivity type, said buried semiconductor region being interposed between at least one of said first well side surface or said second well side surface such that said buried semiconductor region abuts said first or second well side surface but does not contact both of said first and second well side surfaces, said buried semiconductor region having a second dopant concentration of said first conductivity type which is greater than said first dopant concentration of said first conductivity type to reduce leakage across a junction between said semiconductor well and said semiconductor substrate bulk material.

14. A method for reducing junction leakage in a semiconductor device as claimed in claim 13, further comprising:

forming source and drain regions of the first conductivity type in said semiconductor well to define a channel region therebetween, wherein a dopant concentration of said semiconductor well is controlled such that said dopant concentration of said semiconductor well is greater at a boundary with said buried semiconductor region than at said channel region.

* * * * *